United States Patent
Sadot et al.

(10) Patent No.: US 7,283,572 B2
(45) Date of Patent: Oct. 16, 2007

(54) MEASUREMENT OF WAVELENGTH TRANSIENTS IN TUNABLE LASERS

(75) Inventors: Dan Sadot, Kfar Bilu (IL); Yehezkel Joseph, Petach-Tikya (IL)

(73) Assignee: Ben Gurion University of the Negev, Beer Sheva (IL)

( * ) Notice: Subject to any disclaimer, the term of this patent is extended or adjusted under 35 U.S.C. 154(b) by 231 days.

(21) Appl. No.: 11/034,991

(22) Filed: Jan. 12, 2005

(65) Prior Publication Data

US 2005/0180470 A1      Aug. 18, 2005

Related U.S. Application Data

(60) Provisional application No. 60/536,528, filed on Jan. 15, 2004.

(51) Int. Cl.
*H01S 3/13* (2006.01)
(52) U.S. Cl. .......................... 372/32; 372/20
(58) Field of Classification Search ........... 372/20, 372/32
See application file for complete search history.

(56) References Cited

U.S. PATENT DOCUMENTS 4,859,843 A * 8/1989 Baney et al. ............ 250/227.23
5,227,857 A * 7/1993 Kersey ....................... 356/477

OTHER PUBLICATIONS

E. Buimovich and D. Sadot, "Measurements of thermal frequency chirp in directly modulated DFB lasers and thermal transient induced frequency drift during fast tuning in GCSR lasers using frequency discrimination technique," *Proceedings of LEOS Annual Meeting*, Paper TuD7, vol. 1, pp. 208-209, Tucson, Arizona, 2003.

M. Nazrathy et al., "Spectral analysis of optical mixing measurements," *Journal of Lightwave Technology*, vol. 7, No. 7, pp. 1083-1096, Jul. 1989.

D. Sadot and I. Elhanany, "Optical switching speed requirements for Terabit/sec packet over WDM networks," *IEEE Photonics Technology Letters*, vol. 12, No. 4, pp. 440-442, Apr. 2000.

* cited by examiner

*Primary Examiner*—Dung (Michael) T. Nguyen
(74) *Attorney, Agent, or Firm*—Morgan & Finnegan LLP (57) ABSTRACT

A high resolution measurement method and apparatus for tracking wavelength transients in tunable lasers. The apparatus comprises a Mach-Zehnder interferometer (MZI) which is used to generate a self-heterodyne signal between the wavelength transient to be measured, which is effectively the laser signal passed along the time-delayed arm of the MZI, and the laser wavelength after the tuning transient has subsided, which is effectively the same laser signal passed along the direct arm of the MZI. The heterodyne signal is detected on a receiver, and can then be measured with the frequency resolution typical of electronic measurements, such as by means of an oscilloscope. The only laser required is the laser under inspection. The wavelength measurement accuracy is up to twice the laser linewidth, and is only effectively limited by the laser phase noise. The method can be used to implement an automatic frequency control system for tunable lasers.

24 Claims, 4 Drawing Sheets

MEASUREMENT OF WAVELENGTH TRANSIENTS IN TUNABLE LASERS

This application claims priority from U.S. Provisional Application Ser. No. 60/536,528 filed on Jan. 15, 2004, and which is incorporated herein by reference in its entirety.

FIELD OF THE INVENTION

The present invention relates to the field of the characterization and measurement of instantaneous wavelength transients in tunable laser sources, especially by direct optical means which nevertheless enable the accuracy of electronic spectrum measurements.

BACKGROUND OF THE INVENTION

Optical packet switching is considered a key technology in the development of optical communication networks. Fast tunable lasers can be used to color bursts of data according to their destination. A tuning time as fast as the order of a nanosecond enables the implementation of efficient burst switching, as described in the article "Optical switching speed requirements for Terabit/sec packet over WDM networks" by D. Sadot, and I. Elhanany, published in *IEEE Photonics Technology Letters*, Vol. 12, no., 4, pp. 440-442, April 2000. The accurate measurement of wavelength transients increases the efficiency of optical burst switching, by making it possible to ascertain mode stability in the minimum possible time.

A number of different types of tunable lasers which offer the combination of wide tuning range and fast tuning are in common use, such as DBR, SG-DBR, GCSR, and DS-DBR lasers. Such lasers have been implemented in a number of different systems described in various publications.

Figure 1:
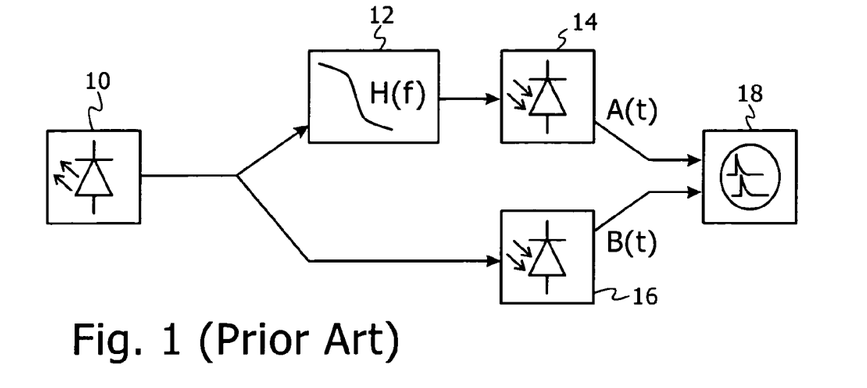
FIG. 1 illustrates schematically a prior art set-up for measuring the spectral wavelength transients of a tunable laser, using a wavelength selective device.

Prior art methods of measuring spectral wavelength transients are often based on the accuracy of an optical wavelength selective element. By applying a step function signal to drive the laser's tuning section(s) and filtering the resulting optical signal through the wavelength selective device, the wavelength transients can be measured. One such experimental method has been described in the article entitled "Measurements of thermal frequency chirp in directly modulated DFB lasers and thermal transient induced frequency drift during fast tuning in GCSR lasers using frequency discrimination technique," by E. Buimovich and D. Sadot, published in the Proceedings of LEOS Annual Meeting, Paper TuD7, vol. 1, pp. 208-209, Tucson, Ariz. 2003, in which there is described an apparatus for performing this method, as shown in FIG. 1. The time resolved frequency evolution of the laser is obtained by $f(t)=H^{-1}(A(t)/B(t))$, where H represents the response of the wavelength selective device as a function of wavelength, and B(t) and A(t) are respectively the time dependent response functions of the laser output resulting from the step input function, and of the laser output resulting from the step input function modified by transmission through the wavelength selective device.

One disadvantage of such time-resolved wavelength measurement methods is that they are limited in spectral resolution by the resolution of the wavelength selective devices, which is generally significantly less than that of electronic filtering and measuring techniques. There therefore exists a need for a method of performing on tunable lasers, high resolution spectral measurements having the accuracy and resolution of electronic filtering techniques.

The disclosures of each of the publications mentioned in this section and in other sections of the specification, are incorporated herein by reference, each in its entirety.

SUMMARY OF THE INVENTION

The present invention seeks to provide a new technique for performing high resolution spectral measurements of laser transient response, which is based on optical signal manipulation yet which nevertheless enables a level of temporal and spectral accuracy typical of electronic signal management.

The technique utilizes a delayed self-heterodyning procedure, in which the laser is subjected to a transient tuning input, preferably by injection of a square wave signal into one of the sections of the laser which controls tuning of the laser. The laser output is sent into a fiber Mach-Zehnder interferometer (MZI) with a differential delay of $\tau$, and the output from the delayed arm is recombined on a photodetector with the output from the direct arm of the MZI. The detected photocurrent can then preferably be displayed on an electronic oscilloscope for measurement. It is assumed that once the transient time has elapsed, the laser under test is set into a single longitudinal mode in the steady state.

In order for the technique to function correctly, the time delay difference between the two MZI arms must generally approach or preferably exceed the laser tuning time, such that the tuning step of the laser output passing through the direct arm is essentially complete before the laser output passing through the delayed arm begins to arrive. The differential delayed MZI effectively acts as an optical self-heterodyne system, whereby the transient laser wavelength pulse which is to be measured, is mixed with a CW local oscillator laser signal derived from the laser itself under test, such that there is no need to use two separate lasers for generating the heterodyne signal. During the tuning process of the laser, the heterodyned spectrum increases rapidly to a very high frequency, and then declines gradually from a high to a low frequency in step with the progress of the laser tuning transient. Since the frequency range of this heterodyne signal is that of the changes in laser frequency as the tuning transient proceeds, this frequency is generally well within the range at which electronic spectral measurements can be performed, such that this technique allows changes in optical frequency occurring during laser tuning to be followed and measured with the accuracy typical of electronic frequency measurements.

The above-mentioned condition, that the time delay difference between the two MZI arms must generally be close to or exceed the laser tuning time, is necessary so that the local oscillator signal can be considered to have settled in an essentially steady mode and with a steady wavelength, to enable a cleanly defined heterodyne signal to be obtained. However, it is to be understood that if the circumstances so demand, this criterion can be somewhat relaxed, meaning that the MZI differential time delay can even be less than the laser tuning time, if a less accurate end result of the heterodyne signal measurement is tolerated, the accuracy of the heterodyne frequency measurement depending on the extent of departure from awaiting the elapse of the entire tuning time. Consequently, it is to be understood that the above-mentioned condition is an optimum situation, but that the invention is also meant to be operable, and is also thuswise understood to be claimed, for situations in which the MZI differential time delay is even less than the laser tuning time, so long as the laser is not so far from completion of the tuning transient that the heterodyne signal obtained cannot be usefully used to make the time measurement with the desired accuracy.

By the end of the effective laser tuning process, the MZI thus acts as an optical self-homodyne system with the self-homodyne frequency equal to twice the laser linewidth, as expounded in the article entitled "Spectral analysis of optical mixing measurements" by M. Nazrathy et al., published in *Journal of Lightwave Technology*, Vol. 7, No. 7, pp. 1083-1989, July 1989. Consequently, the point in time where the measured spectrum at the MZI output is reduced to twice the laser linewidth designates the end of the heterodyne action, and can thus be considered to be the end of the tuning process.

The self heterodyne process described above is mathematically represented by the following expression for the instantaneous field detected i(t):

$$i(t) = h(t) * \mathcal{R}\left[\frac{|A_S(t)|^2}{2} + \frac{|A_L(t-\tau)|^2}{2} + |A_S(t)| \cdot |A_L(t-\tau)|\cos(\omega_{IF}(t)t + \phi_{IF}(t))\right] \quad (1)$$

where:
h(t) is the electrical receiver impulse response,
* denotes the convolution integral,
$\mathcal{R}$ is the receiver responsivity,
$\tau$ is the interferometer delay between the shorter and longer arms of the MZI,
$A_S(t)$ and $A_L(t-\tau_0)$ represent the optical fields incident on the photodetector after passing through the shorter and longer arms respectively,
$\omega_{IF}(t) = \omega_{short}(t) - \omega_{long}(t-\tau)$ is the self-heterodyne angular frequency resulting from the frequency tuning, and
$\phi_{IF} = \phi_{short}(t) - \phi_{long}(t-\tau)$ is the self-heterodyne time varying phase difference resulting from the frequency tuning.

There is thus provided in accordance with a preferred embodiment of the present invention, an optical wavelength transient analyzing system, comprising:
(i) an input port for receiving an optical signal having a wavelength transient,
(ii) a signal divider for splitting the optical signal into at least two samples,
(iii) a first optical path along which a first of the at least two samples is passed,
(iv) a second optical path along which a second of the at least two samples is passed, the second optical path having an optical path length longer than that of the first path, the delay time of a signal traversing the second path compared to one traversing the first path being generally at least as long as the time taken for the wavelength transient to be essentially completed,
(v) a signal combiner which combines the first and the second samples after transit respectively through the first and second paths, such that a heterodyne signal is generated between the first sample after the transient has been completed, and between the second sample while the transient is still occurring,
(vi) an optical signal detector for converting the combined samples into an electronic signal, and
(vii) an electronic module for performing measurements on the electronic signal.

The measurements are preferably time measurements, and may also preferably be such that they enable points along the wavelength transient to be measured with the temporal resolution of the electronic module. In accordance with another preferred embodiment of the present invention, the points along the wavelength transient may be the commencement and termination of the wavelength transient. In any of the above described wavelength transient analyzing systems, the electronic module may preferably be an oscilloscope.

There is further provided in accordance with yet another preferred embodiment of the present invention, an optical wavelength transient analyzing system as described above, and wherein the optical signal having a wavelength transient is the output of a tunable laser during a tuning step. In this case, the sample of the laser output passed through the first optical path operates as an essentially constant frequency local oscillator to generate the heterodyne signal with the sample of the laser output passed through the second optical path. Additionally and preferably, the measurements thus enable the tuning time of the laser to be measured.

In accordance with still another preferred embodiment of the present invention, any of the above described optical wavelength transient analyzing system may also comprise at least one low pass filter having a cut-off frequency, for passing only components of the electronic signal having a frequency below the cut-off frequency. In such cases, the system may also preferably comprise a control circuit, the control circuit inputting a signal derived from the components of the electronic signal having a frequency below the cut off frequency, and generating therefrom an output signal to indicate that the laser tuning step is complete. The control circuit may then preferably be used as an automatic frequency control for the tunable laser.

There is further provided in accordance with still another preferred embodiment of the present invention, a system including at least one low pass filter as described above, and wherein the at least one low pass filter is a plurality of low pass filters, each having its own cut-off frequency, and wherein a selected one of the filters is operative on the electronic signal, such that only components of the electronic signal having a frequency below the cut-off frequency of the selected filter are passed. In this case, the selected one of the filters may preferably be chosen according to the desired closeness of the laser output wavelength to the target wavelength of the tuning step.

In accordance with a further preferred embodiment of the present invention, there is also provided a method of controlling the tuned frequency of a tunable laser during a tuning step, comprising the steps of:
(i) implementing a tuning step of the laser towards a target wavelength,
(ii) dividing the output of the laser during the tuning step into at least two samples,
(iii) directing a first one of the at least two samples along a first optical path,
(iv) directing a second one of the at least two samples along a second optical path, the second optical path having an optical path length longer than that of the first path, the delay time of a signal traversing the second path compared to one traversing the first path being generally at least as long as the time taken for the tuning step to be essentially completed,
(v) combining the first and the second samples after transit respectively through the first and second paths, such that a heterodyne signal is generated between the first sample after the tuning step has been completed, and between the second sample which still shows the tuning step,
(vi) detecting the combined samples on an optical signal detector, such that they are converted into an electronic signal,
(vii) low pass filtering the electronic signal to pass only components of the electronic signal having a frequency below a predefined cut off frequency, and (viii) deriving a control signal from the components of the electronic signal having a frequency below the predefined cut off frequency, the control signal indicating the completion of the laser tuning step.

According to this method, the predefined cut-off frequency preferably defines the closeness of the completion of the tuning step to the target wavelength. Additionally and preferably, the predefined cut-off frequency is selectable, and the method also preferably comprises the additional step of selecting the predefined cut-off frequency according to the desired closeness of the completion of the tuning step to the target wavelength.

There is even further provided in accordance with another preferred embodiment of the present invention, a method of analyzing a wavelength transient in an optical signal, comprising the steps of:
(i) inputting an optical signal having a wavelength transient,
(ii) dividing the optical signal into at least two samples,
(iii) directing a first of the at least two samples along a first optical path,
(iv) directing a second of the at least two samples along a second optical path, the second optical path having an optical path length longer than that of the first path, the delay time of a signal traversing the second path compared to one traversing the first path being generally at least as long as the time taken for the wavelength transient to be essentially completed,
(v) combining the first and the second samples after transit respectively through the first and second paths, such that a heterodyne signal is generated between the first sample after the transient has been completed, and the second sample at least while the transient is still occurring,
(vi) detecting the combined samples on an optical signal detector, such that they are converted into an electronic signal, and
(vii) making measurements on the electronic signal by means of an electronic module. The heterodyne signal is preferably such that it has frequency components substantially lower than the frequency of the optical signal.

In the above described method, the measurements are preferably time measurements, and also preferably enable points along the wavelength transient to be determined with the temporal resolution of the electronic module. The measurements also preferably enable the commencement and termination of the wavelength transient to be measured with the temporal resolution of the electronic module.

There is further provided in accordance with yet another preferred embodiment of the present invention, a method of analyzing a wavelength transient in an optical signal, as described above, and wherein the optical signal having a wavelength transient is the output of a tunable laser during a tuning step towards a target wavelength. In such a case, the sample of the laser output passed through the first optical path preferably operates as an essentially constant frequency local oscillator to generate the heterodyne signal with the sample of the laser output passed through the second optical path. Additionally and preferably, the measurements enable the tuning time of the laser to be determined.

In accordance with still more preferred embodiments of the present invention, the above-described methods of analyzing a wavelength transient in an optical signal may also comprise the steps of:
(viii) low pass filtering the electronic signal to pass only components of the electronic signal having a frequency below a predefined cut off frequency,
(ix) deriving a control signal from the components of the electronic signal having a frequency below the predefined cut off frequency, the control signal indicating the completion of the laser tuning step, and
(x) utilizing the control signal for automatic frequency control of the tunable laser.

In this case, the predefined cut-off frequency may preferably be selectable, and the method then also may preferably comprise the additional step of selecting the predefined cut-off frequency according to the desired closeness of the automatic frequency control of the laser to the target wavelength.

BRIEF DESCRIPTION OF THE DRAWINGS

The present invention will be understood and appreciated more fully from the following detailed description, taken in conjunction with the drawings in which:

FIGS. 2A and 2B are a schematic circuit diagrams of apparatus, constructed and operative according to preferred embodiments of the present invention, for determination of wavelength transients in a tuned laser, according to preferred methods of the present invention.

DETAILED DESCRIPTION OF PREFERRED EMBODIMENTS

Reference is now made to FIG. 1, which illustrates schematically a prior art set-up for measuring the spectral wavelength transients of a tunable laser 10, such as would arise from application of a step-function drive to the laser tuning section. Part of the laser signal is passed to a wavelength selective device 12, and the modified output is detected 14 and viewed on a fast oscilloscope 18. This filtered wavelength transient can then be compared on the oscilloscope with the direct laser output, as detected on a second detector 16, and the transient form can thereby be determined.

Figure 2A:
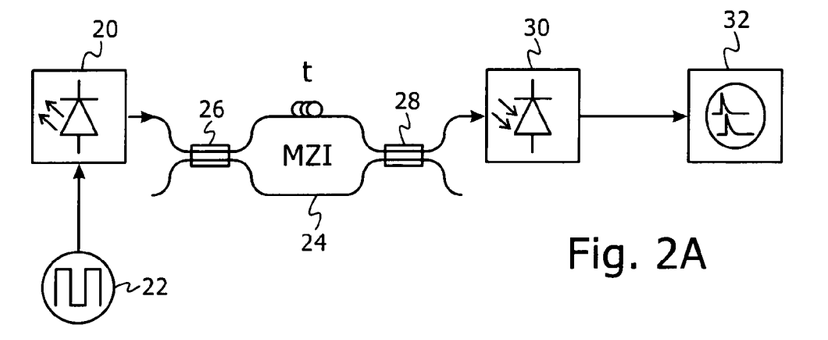
FIG. 2A shows an embodiment for measurement of the wavelength transients.
Figure 2B:
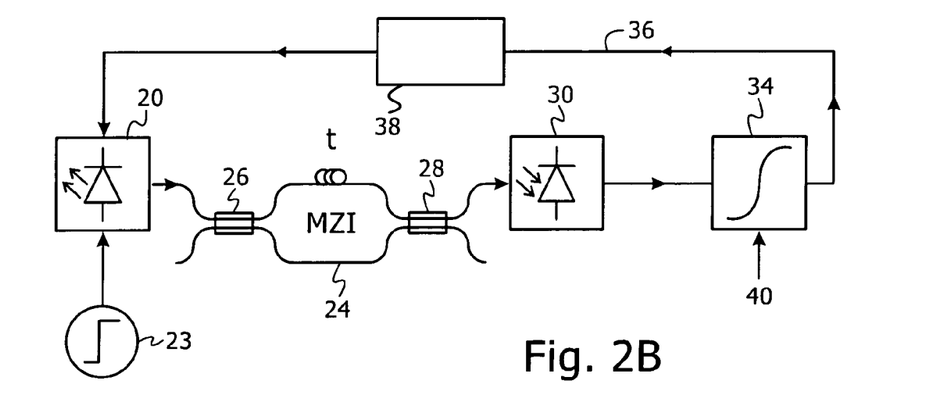
FIG. 2B shows an embodiment for using the determined information on the wavelength transients to provide a feedback signal for various uses, such as an automatic frequency control capability for the tuned laser.

Reference is now made to FIGS. 2A and 2B, which are schematic circuit diagrams of self-heterodyne, temporal frequency measurement apparatus, constructed and operative according to preferred embodiments of the present invention, for measurement or determination of wavelength transients in a tuned laser according to preferred methods of the present invention.

Referring first to FIG. 2A, the laser under test 20 is subjected to a transient tuning input, preferably by injection of a square wave signal 22 into one of the sections of the laser which controls laser tuning. The transient laser output is divided preferably by means of a directional coupler 26, and the two signal parts sent to two arms of a fiber Mach-Zehnder interferometer 24 (MZI) with a differential delay of τ. The outputs from the delayed arm and the direct arm are recombined 28 and the signal detected on a photodetector 30, whose output can then preferably be displayed on a fast electronic oscilloscope 32 for measurement. A mathematical description of the measured self-heterodyne signal, and the necessary limitations for the time delay difference between the two MZI arms have been given in the Summary section hereinabove.

The embodiment shown in FIG. 2A is suitable for use in test equipment, where the measurement is preferably performed visually on the oscilloscope. Reference is now made to FIG. 2B, which is an embodiment, similar in operating principle to that of FIG. 2A, but more suitable for automatic determination of the acquisition of the desired laser tuning wavelength, following a tuning step implemented by the application to the laser of a tuning drive signal 23. The embodiment of FIG. 2B preferably includes one or more low pass filter (LPF) elements 34 to which the detector output signal is passed, and a feedback loop 36 preferably incorporating a control element, 38, which processes the filtered detector output signal and inputs it as a tuning control signal to the tunable laser, preferably through one of its tuning sections. This embodiment is preferably operable as an automatic frequency control system for the tunable laser, as will be explained in detail hereinbelow in connection with the discrete frequency measurement methods shown in FIG. 6, though it is to be understood that the control signal in the feedback loop can be utilized for any control function requiring an accurate knowledge of the tuning evolution of the laser. In order to provide adjustability to the closeness of the AFC, instead of a single LPF, the LPF 34 can be a series of LPF's, each with a different cut-off frequency, or an array of LPF's electronically controlled by means of an input control signal 40, each stage having a different cut off frequency, or even an electronically variable LPF. A measurement scope can also preferably be added at the output, as in FIG. 2A, for setting up the AFC loop. The control element is preferably implemented as an ASIC, thereby enabling miniaturization of the system, and, for instance, the ability to incorporate the AFC module within the laser driver package. It is to be understood, however, that the control circuit will operate equally well using discrete or hybrid circuitry in the control element 38.

Figure 3:
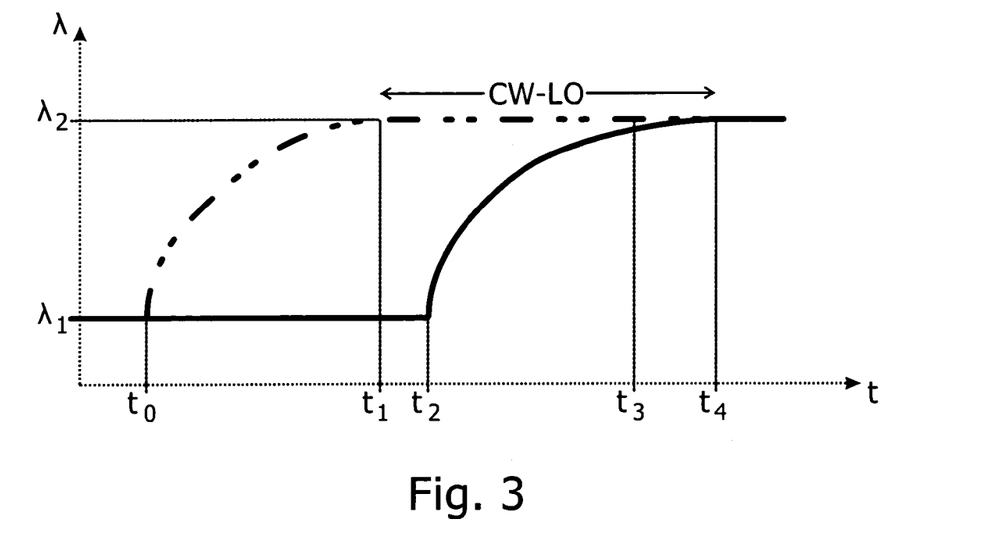
FIG. 3 is a schematic graph showing the wavelength-time relationship between the two outputs of the two arms of the MZI of the apparatus of FIGS. 2A or 2B.

Reference is now made to FIG. 3, which is a schematic graph showing the wavelength-time relationships of the wavelength transient laser output signals for the separate outputs of the two arms of the MZI of the apparatus of FIG. 2A or 2B. The MZI output consists of two wavelength components resulting from the optical waves propagating through the shorter, direct arm, and through the longer, time-delayed arm. The dashed curve represents the optical field output from the shorter arm, and is denoted by $A_S$, and the continuous curve represents the optical field output from the longer arm, and is denoted by $A_L$.

The main timing events depicted in FIG. 3 are as follows:

At time $t_0$, the optical field $A_S$ associated with the beginning of the laser tuning process is incident on the photodetector after passing through the shorter arm of the MZI.

At time $t_1$, the optical field $A_S$ associated with the end of the laser tuning process is incident on the photodetector after passing through the shorter arm of the MZI, and $A_S$ adopts an essentially constant level. At this point in time, $A_S$ begins its "local oscillator" functionality.

At time $t_2$, the optical field $A_L$ associated with the beginning of the laser tuning is incident on the photodetector after passing through the longer arm of the MZI.

At time $t_3$, the optical field $A_S$ has a stable wavelength, while the wavelength of the optical field $A_L$ is still tuning.

At time $t_4$, the optical field $A_L$ associated with the end of the laser tuning is incident on the photodetector after passing through the longer arm of the MZI, by which time both optical field have the same frequency and the heterodyne signal disappears.

It is during the time interval $[t_2, t_4]$ that the wavelength transients of the laser under test can be measured using the techniques of the present invention. In this time interval, the detected signal on the photodetector is a self-heterodyned signal generated by beating of the wavelength transients of the laser undergoing transient wavelength change during retuning, with the direct laser output operating as a CW local oscillator after the tuning transient has been completed. Each point, at time $t_3$ within this interval, is utilized for an exact time-to-wavelength mapping. During this interval, the electronic heterodyne signal frequency f(t) at time t is related to the wavelength difference between the two MZI arms output by the expression:

$$f(t) = \frac{c}{\lambda(t)} - \frac{c}{\lambda_2}, \qquad (2)$$

where λ(t) is the time varying wavelength under test output from the longer arm, and $\lambda_2$ is the steady state wavelength value, output from the shorter arm. Consequently, by rearranging equation (2), the instantaneous wavelength of the tunable laser can be evaluated from the expression:

$$\lambda(t - t_2) = \frac{c\lambda_2}{c + \lambda_2 f(t)} \qquad (3)$$

where t is now measured from the point of time $t_2$. Equation (3) is the final form for achieving the high-resolution spectral and temporal relationship using the measurement method of the present invention.

Figure 4:
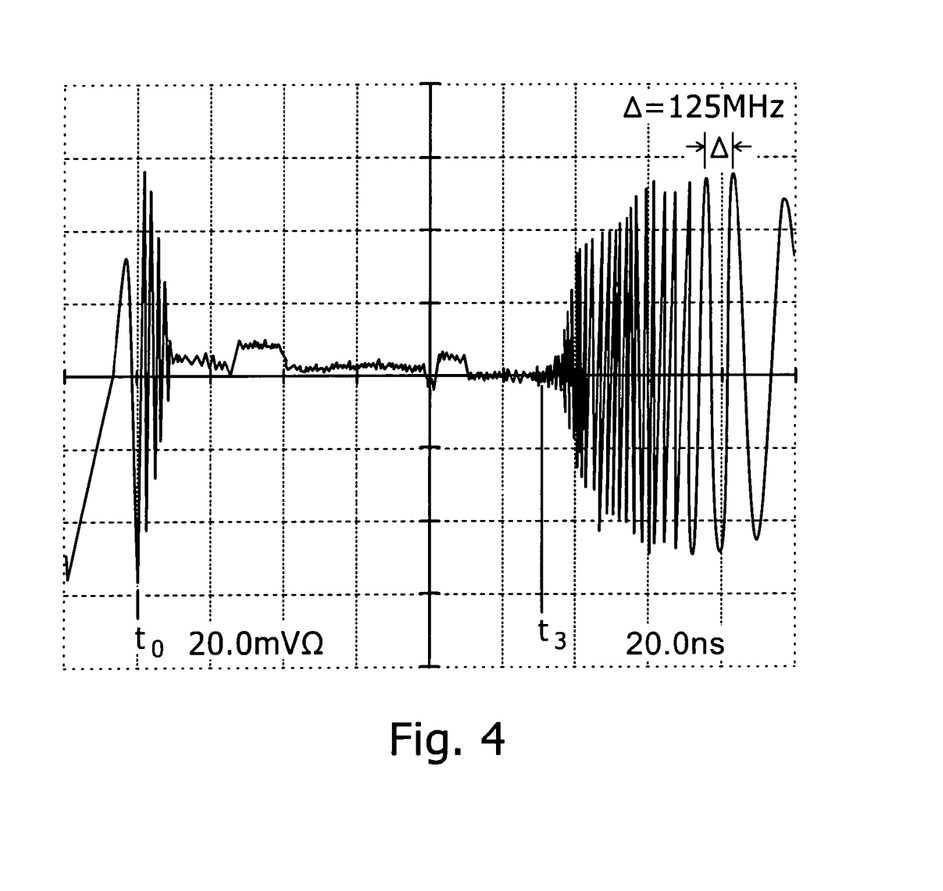
FIG. 4 is an exemplary output trace obtained on an oscilloscope during the measurement of a complete tuning cycle of a tunable laser, using the preferred apparatus of FIG. 2A.
Figure 5:
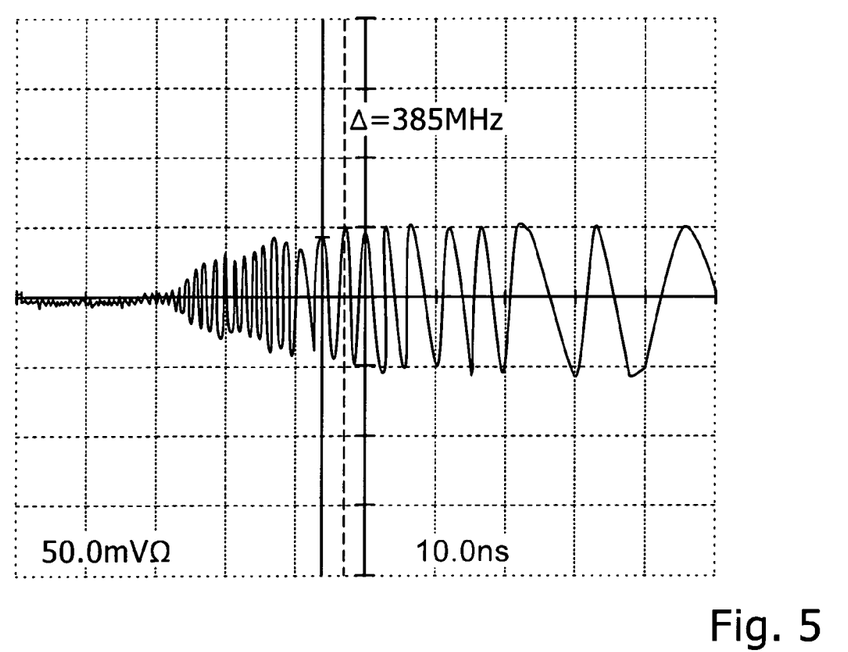
FIG. 5 is a zoom-in of the right hand side of the trace of FIG. 4, and it enables a continuous method of measuring the time-frequency evolution of the laser tuning.
Figure 6:
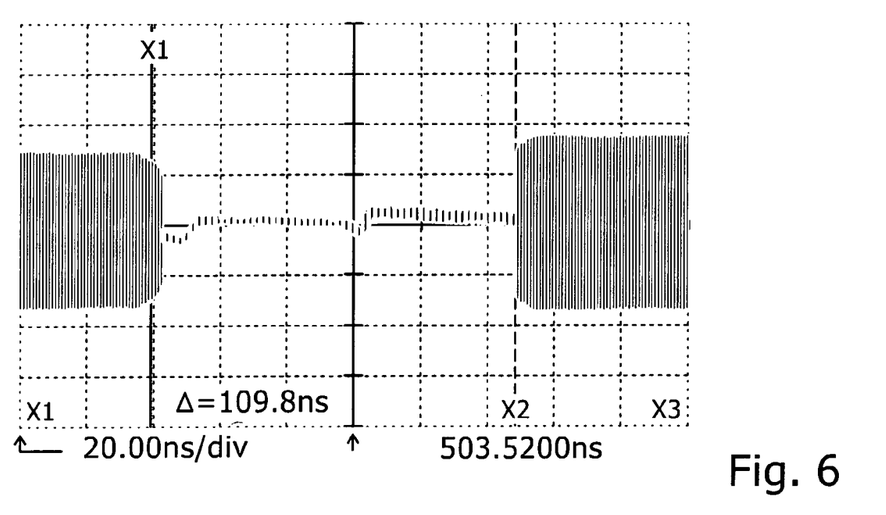
FIG. 6 is an oscilloscope trace illustrating a discrete method of determining the time-frequency evolution of the laser tuning process, such as would preferably be used in the apparatus of FIG. 2B.

Reference is now made to FIGS. 4 to 6, which illustrate exemplary output traces obtained on an oscilloscope during the measurement of the transient tuning of a tunable laser, to illustrate the use and performance of the preferred apparatus and methods of the present invention. A GCSR tunable laser supplied by the now defunct Altitune of Sweden, provided the output curve examples shown in FIGS. 4 to 6. The measured laser linewidth was 22.5 MHz, corresponding to a laser coherence length of $L_c$=2.83 m. A square wave tuning current signal at 2.5 MHz was injected into the coupler section of the laser. As a result, the laser emission alternated between the two wavelengths $\lambda_1$=1539.052 nm and $\lambda_2$=1543.188 nm (Δυ=522.1 GHz) for the high and low current states. An MZI configuration with an arm delay difference of 10.96 m was used, corresponding to a differential time delay of 54.8 nsec, this corresponding to the interval $t_2-t_0$ in FIG. 3. In the measurement instrumentation of FIG. 2, the plots were obtained using an optical receiver 30, having a 3 GHz bandwidth, 500 MHz and 20 GHz bandwidth oscilloscopes 32, and various electronic lowpass filters in the range of 500 MHz-3 GHz, not shown in FIG. 2. It is to be understood however, that these are only preferred examples of instruments used for performing the measurements shown in FIGS. 4 to 6, and that the apparatus and methods of the present invention are not understood to be thus limited, but are executable using any instruments suitable for the measurements to be undertaken.

Reference is now made to FIG. 4, which is illustrative of the trace obtained for a full tuning cycle. At time $t_0$ the beginning of wavelength tuning is observed by the increasing frequency of the heterodyne signal which rapidly increases beyond the electronic system bandwidth and therefore is filtered out. As the laser approaches and stabilizes at its final wavelength value, the frequency difference between the lightwaves at the two MZI arms decreases and the heterodyne signal is observed again by the electronic system. This can be seen at time $t>t_3$, where at approximately $t_3$, the heterodyne signal once again falls to a frequency within the system bandwidth.

Reference is now made to FIG. 5, which is a zoom-in of the right hand side of FIG. 4, and it enables a continuous method of measuring the time-frequency evolution of the laser tuning process. For example, at $t_3=135$ ns, a heterodyne frequency of 385 MHz is measured, corresponding to an instantaneous wavelength $\lambda_{13}=1543.185$ mn according to equation (3). Therefore, in this example, the actual laser tuning time to within a frequency accuracy of 385 MHz from the final desired wavelength, is $t_3-t_2=135-54.8=80.2$ nsec. Similarly, the laser tuning time can be continuously calculated for any required frequency accuracy down to approximately 50 MHz. Below this frequency the signal effectively becomes self-homodyne and represents only the laser phase noise. This can be observed at the very right hand side of FIG. 5.

Reference is now made to FIG. 6, which demonstrates a discrete method of determining the time-frequency evolution of the laser tuning process. This technique is the basis of the system shown in FIG. 2B for providing frequency control to the laser during tuning. The method is based on filtering the electrical signal from the detector using discrete electronic lowpass filters (LPF) 34 with sharp frequency roll-off, thus measuring accurately the time stamp where the heterodyne frequency reaches the LPF cutoff frequency. In the preferred example shown in FIG. 6, an LPF with a 3 dB cutoff frequency of 2950 MHz (1 dB cutoff at 2700 MHz) is used, and the output viewed on a 20 GHz bandwidth oscilloscope. As observed in the trace of FIG. 6, between the two cursors, X1 and X2, the laser reaches within 2.95 GHz (as predetermined by the LPF cut-off frequency) of its tuning accuracy, corresponding to a wavelength of 1543.166 nm, after 109.8 nsec. Therefore, the laser tuning time up to this accuracy is given by $t_3-t_2=109.8-54.8=55$ nsec.

The control element, 38, shown in FIG. 2B preferably incorporates a level discriminator or comparator, which detects when a predetermined signal threshold is exceeded, this signal indicating that the LPF is now passing the detector output signal, and that the laser wavelength is thus within the predetermined range of its target wavelength. The outer limit of this predetermined range is determined by the low pass frequency of the LPF. The control element then generates a signal indicating that the tuning step is complete to within the desired accuracy of tuning, and this signal is input into the tuning drive circuits to stop the tuning step. The tightness of the tuning can be made adjustable by using a series of LPF's, or an adjustable LPF array, such that the closeness of the laser tuning to its target wavelength can be selected electronically by choice of the appropriate LPF frequency.

Figure 7:
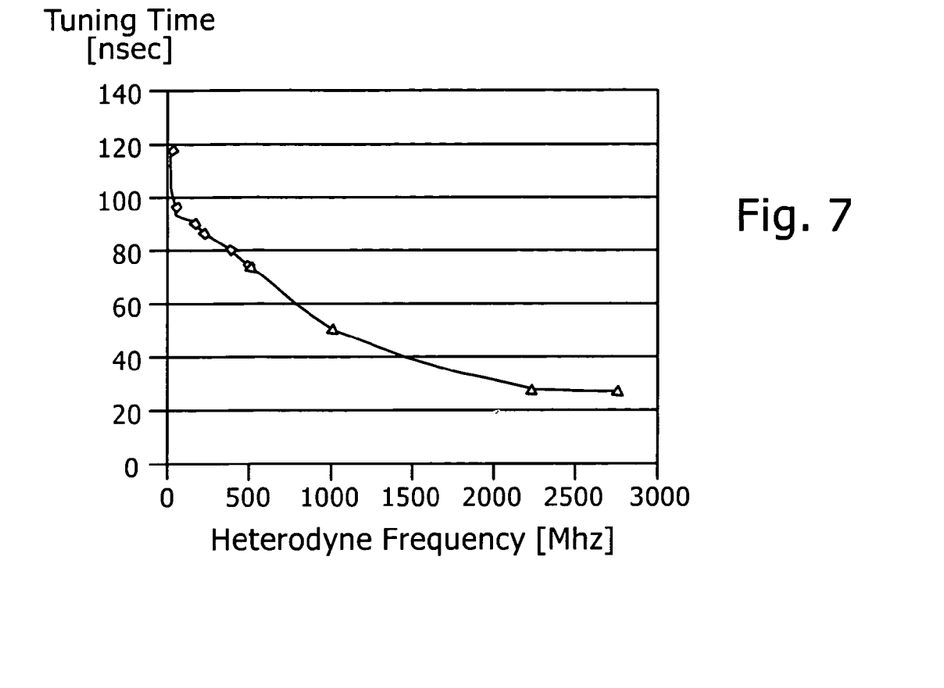
FIG. 7 is a graph showing the tuning measurement results for a GCSR laser tuned by the coupler section, using both the continuous method of FIG. 5 and the discrete method of FIG. 6.

Reference is now made to FIG. 7, which is a graph showing the tuning measurement results for a GCSR laser tuned by the coupler section, using both the continuous and discrete proposed methods. The X-axis which is the heterodyne frequency represents the tuning wavelength accuracy and the Y-axis is the tuning time. The low heterodyne frequencies up to 500 MHz are measured using the continuous method, as illustrated in FIG. 5, and are shown on the graph by means of diamond shaped points, while at frequencies above 500 MHz, the discrete method is used, as illustrated in FIG. 6, these points being shown in the graph by squares. The 500 MHz heterodyne frequency was measured using both methods and the comparison is seen to be good.

Figure 8:
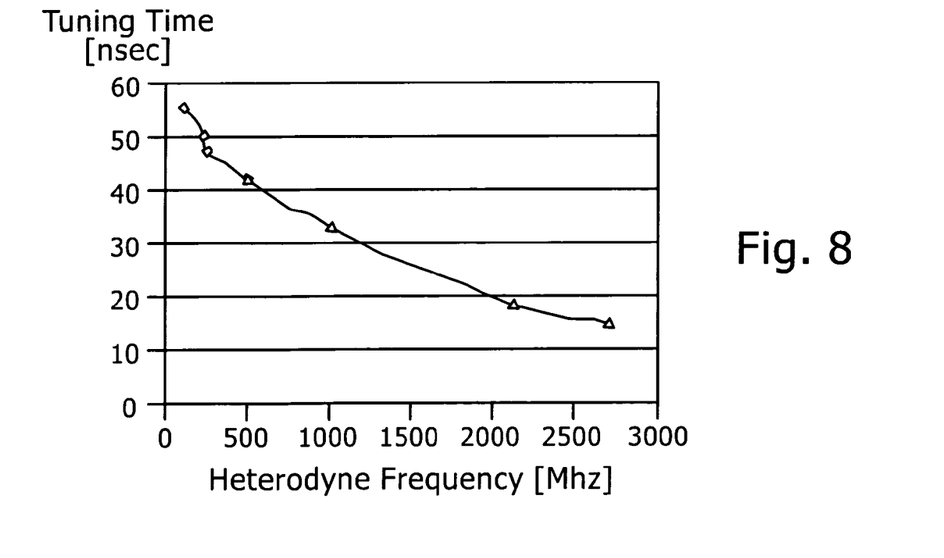
FIG. 8 is a graph similar to that of FIG. 7, but using the phase section to tune the laser.

Reference is now made to FIG. 8, which shows tuning results similar to those shown in FIG. 7 but obtained when tuning the GCSR laser by driving the phase section only. In this example shorter tuning times are observed while tuning between two adjacent wavelengths $\lambda_1=1528.610$ nm and $\lambda_2=1528.658$ nm.

These graphs illustrate the accuracy and simplicity by which the laser tuning measurements can be made using the preferred apparatus and methods of the present invention.

It is appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

We claim:

1. An optical system comprising:
    an input port;
    a signal divider coupled to the input port and configured to divide an optical signal into at least first and second samples;
    a first optical path and a second optical path, the first and second optical paths being coupled to an output of the signal divider, the second optical path having an optical path length that is longer than the optical path length of the first optical path such that said second sample traversing the second path will be delayed relative to said first sample traversing the first path by a time that is at least as long as is necessary for a wavelength transient of the optical signal to be completed;
    a signal combiner that will combine the first and second samples after transit through said optical paths to generate an optical heterodyne signal; and
    an optical signal detector coupled to the signal combiner that will convert the optical heterodyne signal into an electronic signal,
    wherein said optical heterodyne signal is such that said electronic signal has frequency components substantially lower than the frequency of said optical signal.

2. The optical system according to claim 1 wherein said wavelength transient is determined with temporal resolution associated with said electronic signal.

3. The optical system according to claim 1 wherein the commencement and termination of said wavelength transient is determined with temporal resolution associated with said electronic signal.

4. The optical system according to claim 1 wherein said optical signal having a wavelength transient is the output of a tunable laser during a tuning towards a target wavelength.

5. The optical system according to claim 1 wherein said first sample of said optical signal traversing said first optical path operates as an essentially constant frequency local oscillator to generate said heterodyne signal with said second sample of said optical signal traversing said second optical path.

6. The optical system according to claim 4 wherein said electronic signal enables the tuning time of said laser to be measured.

7. The optical system according to claim 1, further comprising:
a display module for making time measurements on said electronic signal.

8. The optical system according to claim 7 wherein said display module is an oscilloscope.

9. The optical system according to claim 4 further comprising:
at least one low pass filter having a cut-off frequency, said filter being adapted to pass only components of said electronic signal having a frequency below said cut off frequency.

10. The optical system according to claim 9, further comprising:
a control circuit, said control circuit adapted to input a signal derived from said components of said electronic signal having a frequency below said cut off frequency, and to generate therefrom an output signal to indicate that said laser tuning step is complete.

11. The optical system according to claim 10, wherein said control circuit is an automatic frequency control for said tunable laser.

12. The optical system according to claim 9 wherein said at least one low pass filter is a plurality of low pass filters, each having its own cut-off frequency, and wherein a selected one of said filters is operative on said electronic signal such that only components of said electronic signal having a frequency below said cut-off frequency of said selected filter are passed.

13. The optical system according to claim 12 wherein said selected one of said filters is chosen according to the desired closeness of said laser output wavelength to the target wavelength of said tuning step.

14. A method comprising:
tuning a tunable laser towards a target wavelength;
dividing the output of said laser into at least a first and a second sample;
directing said first sample along a first optical path;
directing said second sample along a second optical path, said second optical path having an optical path length longer than that of said first optical path such that said second sample traversing said second path will be delayed relative to said first sample traversing said first path by a time that is at least as long as will be needed for the tuning to be essentially completed;
combining said first and said second samples after transit respectively through said first and second paths, such that an optical heterodyne signal is generated between said first sample and said second sample;
converting said optical heterodyne signal into an electronic signal using an optical signal detector;
filtering said electronic signal by passing only components of said electronic signal having a frequency below a predefined cut off frequency; and
deriving a control signal from said components of said filtered electronic signal, said control signal indicating whether laser tuning is complete.

15. The method of claim 14 wherein said predefined cut-off frequency defines the closeness of said completion of said tuning to said target wavelength.

16. The method of claim 15 wherein said predefined cut-off frequency is selectable, and comprising the additional step of selecting said predefined cut-off frequency according to the desired closeness of said completion of said tuning to said target wavelength.

17. A method comprising:
inputting an optical signal having a wavelength transient;
dividing said optical signal into at least a first and a second sample;
directing said first sample along a first optical path;
directing said second sample along a second optical path, said second optical path having an optical path length longer than that of said first path, such that said second sample traversing said second path will be delayed relative to said first sample traversing said first path by a time that is at least as long as will be needed for said wavelength transient to be essentially completed;
combining said first and said second samples after transit respectively through said first and second paths, such that an optical heterodyne signal is generated between said first sample and said second sample; and
inputting said optical heterodyne signal to an optical signal detector, that will convert the optical heterodyne signal into an electronic signal,
wherein said heterodyne signal is such that said electronic signal has frequency components substantially lower than the frequency of said optical signal.

18. The method of claim 17 wherein said wavelength transient is determined with the temporal resolution of said electronic signal.

19. The method of claim 17 wherein the commencement and termination of said wavelength transient are determined with the temporal resolution of said electronic signal.

20. The method of claim 17 wherein said optical signal having a wavelength transient is the output of a tunable laser during tuning towards a target wavelength.

21. The method of claim 20 wherein said first sample of said laser output traversing said first optical path operates as an essentially constant frequency local oscillator to generate said heterodyne signal with said second sample of said laser output traversing said second optical path.

22. The method of claim 20 wherein said electronic signal enables the tuning time of said laser to be determined.

23. The method of claim 20 further comprising:
filtering said electronic signal by passing only components of said electronic signal having a frequency below a predefined cut off frequency;
deriving a control signal from said components of said filtered electronic signal, said control signal indicating whether laser tuning is complete; and
utilizing said control signal for automatic frequency control of said tunable laser.

24. The method of claim 23 wherein said predefined cut-off frequency is selectable, said method further comprising selecting said predefined cut-off frequency according to the desired closeness of said automatic frequency control of said laser to said target wavelength.

* * * * *